(12) United States Patent
Yamasaki et al.

(10) Patent No.: US 7,829,387 B2
(45) Date of Patent: Nov. 9, 2010

(54) ELECTRONIC APPARATUS AND METHOD OF MANUFACTURING THE SAME

(75) Inventors: Masashi Yamasaki, Nagoya (JP); Mutsumi Yoshino, Nagoya (JP)

(73) Assignee: Denso Corporation, Kariya (JP)

( * ) Notice: Subject to any disclaimer, the term of this patent is extended or adjusted under 35 U.S.C. 154(b) by 13 days.

(21) Appl. No.: 12/385,693

(22) Filed: Apr. 16, 2009

(65) Prior Publication Data
US 2009/0199400 A1     Aug. 13, 2009

Related U.S. Application Data

(62) Division of application No. 11/607,922, filed on Dec. 4, 2006, now Pat. No. 7,679,170.

(30) Foreign Application Priority Data

Dec. 6, 2005 (JP) .............................. 2005-352664

(51) Int. Cl.
*H01L 21/00* (2006.01)
(52) U.S. Cl. ..................... 438/121; 438/122; 438/118; 438/125
(58) Field of Classification Search ...................... None
See application file for complete search history.

(56) References Cited

U.S. PATENT DOCUMENTS

| | | | |
|---|---|---|---|
| 5,042,148 A | 8/1991 | Tada et al. | |
| 5,332,921 A | 7/1994 | Dousen et al. | |
| 5,497,291 A | 3/1996 | Hosen | |
| 5,521,437 A | 5/1996 | Oshima et al. | |
| 6,353,541 B1 * | 3/2002 | Leman et al. | ................ 361/809 |
| 7,108,519 B2 | 9/2006 | Tomikawa et al. | |
| 7,145,231 B2 | 12/2006 | Hasebe et al. | |

(Continued)

FOREIGN PATENT DOCUMENTS

CN     2600821 Y     1/2004

(Continued)

OTHER PUBLICATIONS

Chinese Office Action dated Oct. 17, 2008, issued in counterpart Chinese Application No. 200610164147.X with translation.

(Continued)

*Primary Examiner*—Matthew S Smith
*Assistant Examiner*—Nicholas Tobergte
(74) *Attorney, Agent, or Firm*—Nixon & Vanderhye PC

(57) ABSTRACT

An electronic apparatus includes metal wiring plates placed together in the same plane to provide a wiring circuit, electronic devices mounted to the wiring plates through a solder, a case having a base portion and columnar portions extending from the base portion. The wiring plates are fixed to the columnar portions such that the wiring circuit is spaced from the base portion. The wiring plates have an enough thickness to resist a large current for operating the electronic devices and to release heat generated by the electronic devices. The wiring circuit is spaced from the base portion of the case so that the heat generated by the electronic devices is released in the space efficiently. The electronic devices are soldered to the wiring plates at once in a thermal reflow process.

8 Claims, 8 Drawing Sheets

U.S. PATENT DOCUMENTS

| | | | |
|---|---|---|---|
| 7,176,388 B2* | 2/2007 | Tanabe et al. | 174/520 |
| 7,203,073 B2 | 4/2007 | Kawakita et al. | |
| 7,443,036 B2* | 10/2008 | Iwasaki et al. | 257/777 |
| 7,479,345 B2* | 1/2009 | Nakamura | 429/129 |
| 2003/0013013 A1* | 1/2003 | Nakamura | 429/159 |
| 2004/0065894 A1 | 4/2004 | Hashimoto et al. | |
| 2004/0119155 A1 | 6/2004 | Hisada et al. | |
| 2005/0153583 A1 | 7/2005 | Kawamura et al. | |
| 2007/0145580 A1 | 6/2007 | Satou et al. | |

FOREIGN PATENT DOCUMENTS

| | | |
|---|---|---|
| JP | 63-131521 | 8/1988 |
| JP | 1-62662 | 4/1989 |
| JP | 11-284374 | 10/1999 |
| JP | 2004-120838 | 4/2004 |

OTHER PUBLICATIONS

Official Action dated Jun. 24, 2009, issued in parent U.S. Appl. No. 11/607,922, of Yamasaki et al, filed Dec. 4, 2006.

Japanese Office Action dated Jul. 6, 2010, issued in corresponding Japanese Application No. 2005-352664, with English translation.

\* cited by examiner

US 7,829,387 B2

ELECTRONIC APPARATUS AND METHOD OF MANUFACTURING THE SAME

CROSS-REFERENCE TO RELATED APPLICATION

This application is a Divisional of application Ser. No. 11/607,922, filed Dec. 4, 2006, the entire contents of which are hereby incorporated by reference into this application. This application is also based on and claims priority from Japanese Patent Application No. 2005-325664, filed on Dec. 6, 2005, the contents of which are hereby incorporated by reference into this application.

FIELD OF THE INVENTION

The present invention relates to an electronic apparatus and a method of manufacturing the electronic apparatus.

BACKGROUND OF THE INVENTION

An electronic apparatus used in a vehicle control system such as an anti-lock braking system (ABS), or an electronic stability control (ESC) needs both a power electronic device for driving an actuator and a control electronic device for controlling the actuator. Conventionally, the power and control electronic devices are mounted together on a multilayer printed circuit board to form an electronic circuit board as a major component of the electronic apparatus.

As shown in FIG. 9, a conventional electronic circuit board 110 includes power electronic devices P1-P3 and control electronic devices S1-S3. The power electronic devices P1-P3 and control electronic devices S1-S3 are mounted together on a printed circuit board 9. The power electronic devices P1-P3 are a solenoid relay, a power zener diode, an aluminum electrolytic capacitor, a motor relay, or the like. Each of the power electronic devices P1-P3 operates with a large current to drive the actuator. The control electronic devices S1-S3 are an integrated-circuit (IC), a microcomputer, a solenoid driver, or the like. Each of the power electronic devices S1-S3 operates with a small current to control the actuator. The printed circuit board 9 is a glass epoxy board having multiple wiring layers.

All necessary circuits are mounted on the printed circuit board 9. Therefore, the electronic circuit board 110 can be easily assembled with a case into the electronic apparatus.

Since the power electronic devices P1-P3 operate with the large current, each of the wiring layers of the printed circuit board 9 needs to resist the large current. Further, the power electronic devices P1-P3 generate heat. Therefore, the wiring layers need to not only resist the large current but also release the heat.

However, the wiring layers are made from a relatively thin metallic sintered-paste or film. Therefore, the printed circuit board 9 needs to have a large size to allow the thin wiring layers to resist the large current and release the heat. As a result, the electronic apparatus is increased in size.

As shown in FIG. 10, another conventional electronic circuit board 120 disclosed in JP-2004-200464A includes a busbar 10 having wiring portions 11 and terminal portions 12. Electronic devices 30, 31 are mounted on the wiring portions 11 through solder portions 40. The wiring portions 11 except the solder portions 40 are coated with a solder resist 60.

The busbar 10 is housed in a case 20 made of an electrical insulating material such as ceramics or resin. The case 20 consists of an upper case 21 and a lower case 22. The wiring portions 11 are sandwiched between the upper and lower cases 21, 22 and the upper and lower cases 21, 22 are joined together by means of mechanical engagement or adhesive engagement. Thus, the wiring portions 11 are joined together and housed in the case 20. The terminal portions 12 project outwardly from the case 20.

The busbar 10 is a metal plate greater in thickness than the wiring layers of the electronic circuit board 110 of FIG. 9. Therefore, the busbar 10 can resist the large current for operating the electronic devices 30, 31 and release the heat generated by the electronic devices 30, 31 sufficiently.

Typically, when the busbar is used as the wiring circuit, through hole devices (THD) are used as the electronic devices. The busbar except the terminal portions is molded with the resin case and lead wires of the THDs are connected to the terminal portions by laser welding.

In contrast, in the electronic circuit board 120, surface mount devices (SMD) are used as the electronic devices and the SMDs are soldered on the busbar 10 at once in a thermal reflow process. Therefore, high-density mounting is available and the electronic circuit board 120 can be manufactured at low cost as compared to the electronic circuit board having the THDs mounted by laser welding.

In the electronic circuit board 120, however, the wiring portions 11 are sandwiched between the upper and lower cases 21, 22 to be joined together. This approach limits flexibility of circuit design. Therefore, the electronic circuit board 120 cannot achieve a large-scale circuit for the electronic apparatus used in the ABS or ESC.

SUMMARY OF THE INVENTION

In view of the above-described problem, it is an object of the present invention to provide an electronic apparatus having an increased flexibility of circuit design without reductions in current carrying capacity and heat release rate, and to provide a method of manufacturing the electronic apparatus at low cost.

An electronic apparatus includes wiring plates placed together in the same plane to provide a wiring circuit, electronic devices mounted to the wiring plates through a solder member, a case having a base portion and columnar portions extending from the base portion. The wiring plates are fixed to the columnar portions of the case such that the wiring circuit is spaced from the base portion of the case.

The wiring plates are metal plates having an enough thickness to resist a large current for operating the electronic devices and to release heat generated by the electronic devices. The wiring circuit is spaced from the base portion of the case, so that the heat generated by the electronic devices is released in the space efficiently and thermal stress of the case on the solder paste is reduced. Therefore, the electronic apparatus can be installed in a high temperature environment such as in a vehicle.

Since the electronic devices are mounted to the wiring plates through the solder member, the electronic devices can be mounted to the wiring plates at once in a thermal reflow process. Therefore, the electronic apparatus can be manufactured at low cost as compared to a conventional electronic apparatus having through hole devices mounted by laser welding. The columnar portions, where the wiring plates are fixed, can be provided in desired locations on the base portion of the case. Thus, flexibility of circuit design is increased so that the wiring circuit can have various circuit patterns to provide a large-scale circuit.

BRIEF DESCRIPTION OF THE DRAWINGS

The above and other objectives, features and advantages of the present invention will become more apparent from the following detailed description made with reference to the accompanying drawings. In the drawings.

DETAILED DESCRIPTION OF THE PREFERRED EMBODIMENT

Figure 1A:
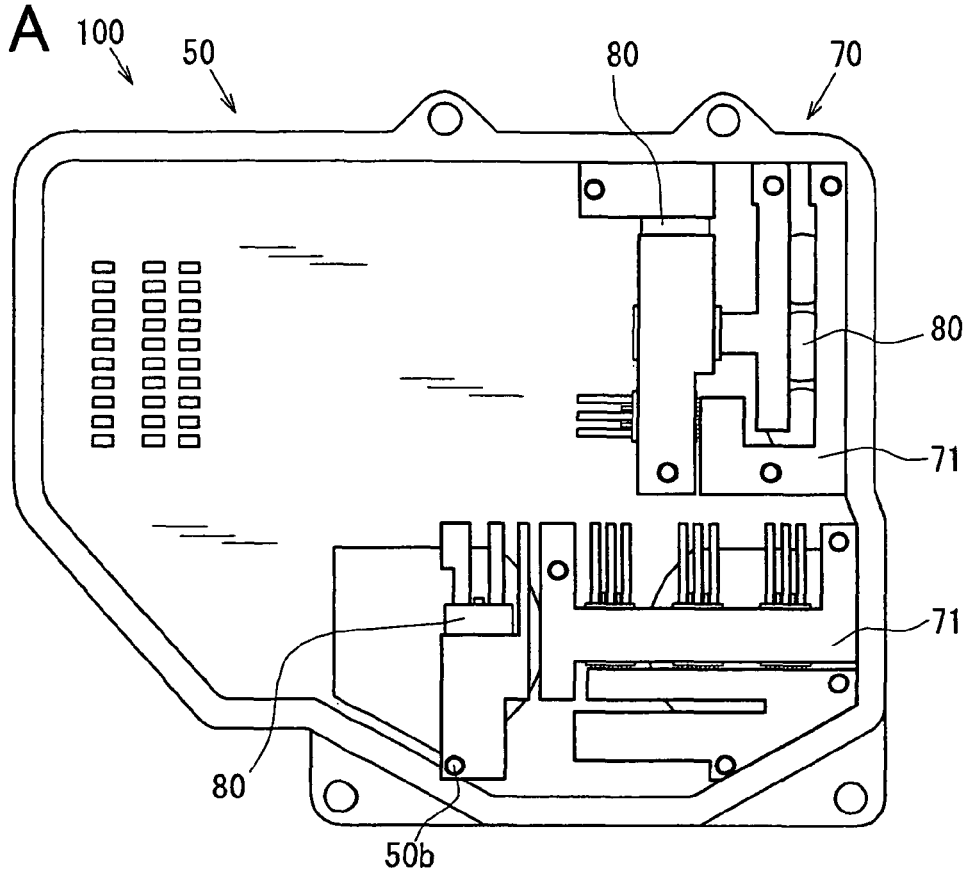
FIG. 1A is a top view of an electronic apparatus according to an embodiment of the present invention.
Figure 1B:
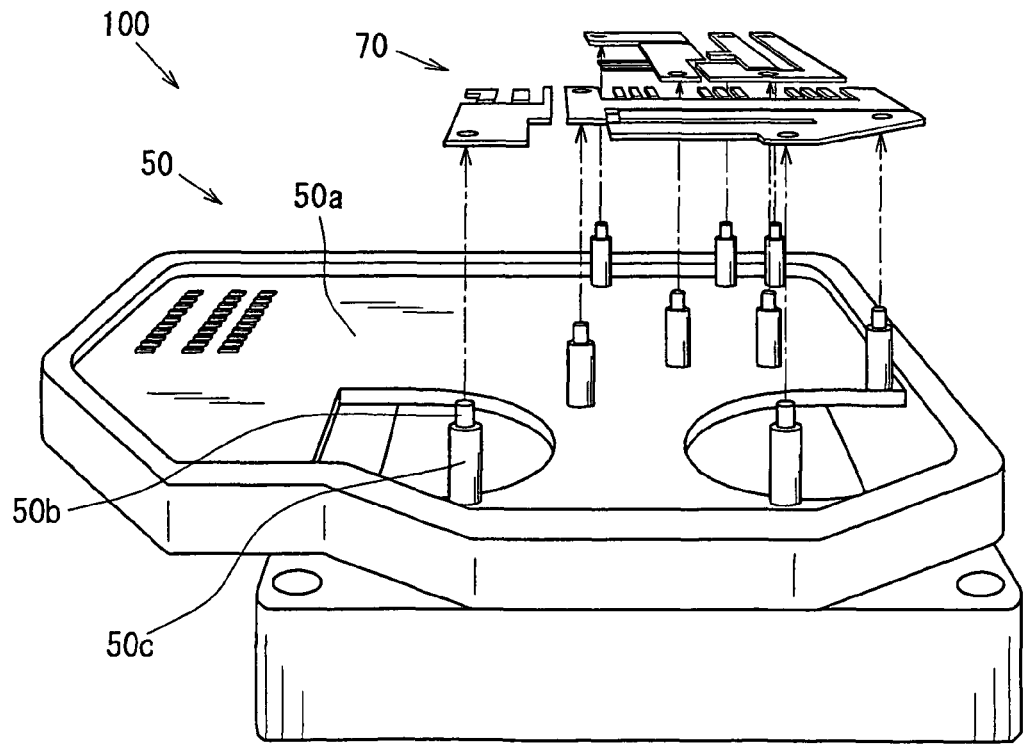
FIG. 1B is an exploded view of the electronic apparatus of FIG. 1A.

As shown in FIGS. 1A and 1B, an electronic apparatus 100 includes a wiring circuit 70 having wiring plates 71, electronic devices 80, and a case 50 for supporting the wiring circuit 70.

Figure 3A:
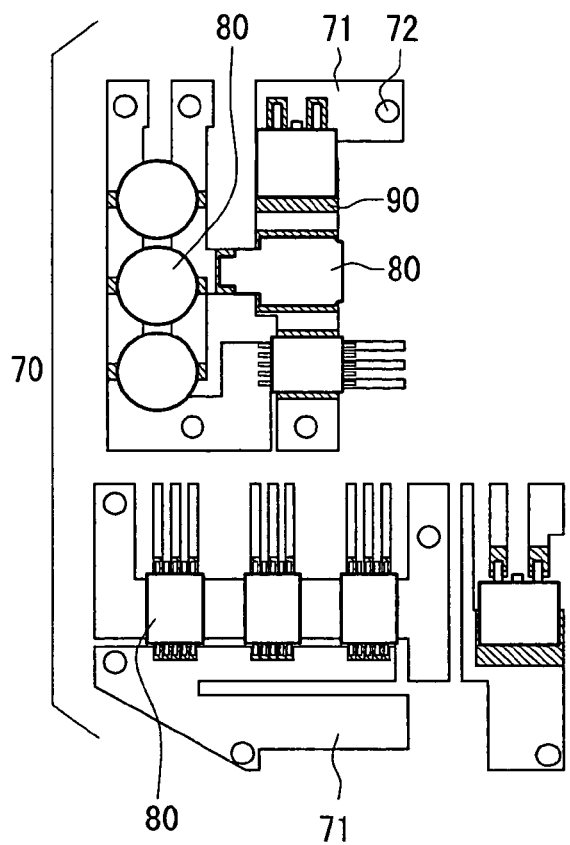
FIG. 3A is a one side view of the wiring circuit of the electronic apparatus.
Figure 3B:
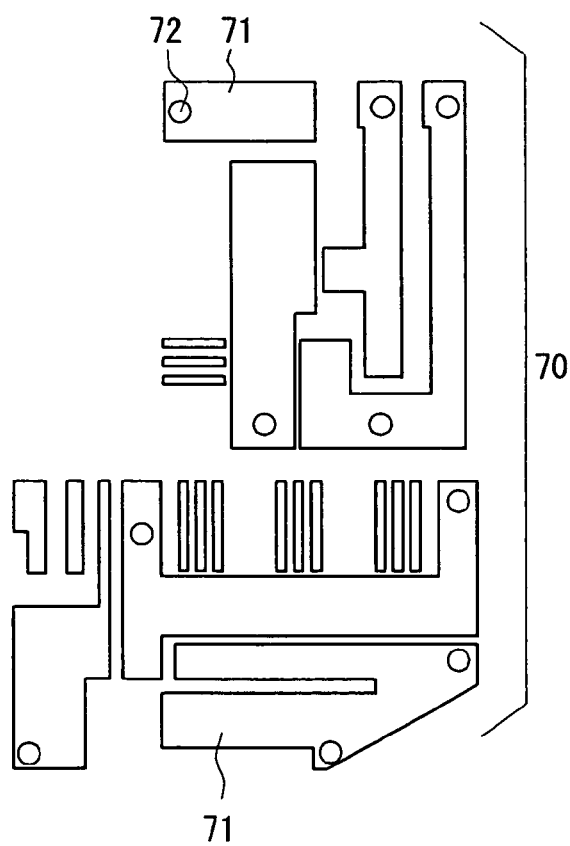
FIG. 3B is an other side view of the wiring circuit of the electronic apparatus.

The wiring plates 71 are placed on the same plane to provide the wiring circuit 70. Each of the wiring plates 71 has a predetermined shape and some of the wiring plates 71 have through holes 72, as shown in FIGS. 3A and 3B.

The electronic devices 80 are mounted to the wiring plates 71 through solder pastes 90. The solder pastes 90 may be, for example, lead (i.e., Pb) free solders having a lead content of less than or equal to 0.1% by weight (wt %) and low wettability. In such an approach, the use of the lead, which is a hazardous material, can be avoided and the solder pastes 90 can suitably spread over the wiring plates 71 in a thermal reflow process.

The case 50 is made of resin and includes a base portion 50a and columnar portions 50c extending vertically from the base portion 50a. The columnar portions 50c have top portions 50b smaller in diameter than the columnar portions 50c. The top portions 50b of the columnar portions 50c are inserted through the through holes 72 of the wiring plates 71. The top portions 50b are deformed by application of heat and pressure so that the wiring plates 71 are fixed to the columnar portions 50c. Thus, the wiring circuit 70 is mounted to the case 50 to be spaced from the base portion 50a.

Figure 2A:
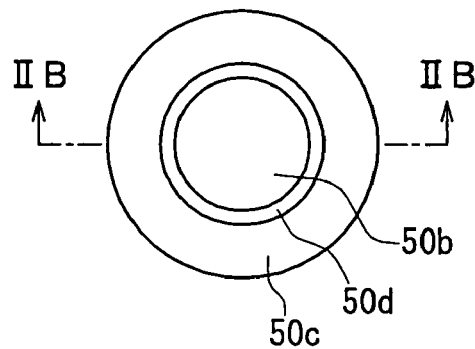
FIG. 2A is a top view of a columnar portion of a case of the electronic apparatus.
Figure 2B:
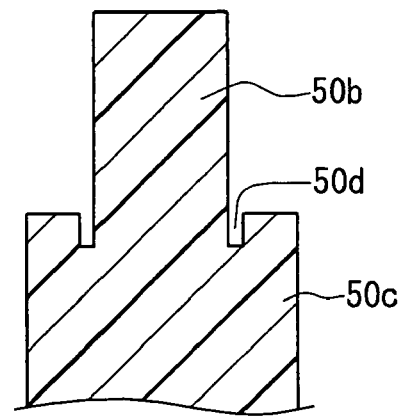
FIG. 2B is a cross-sectional view of the columnar portion taken along line IIB-IIB in FIG. 2A.
Figure 2C:
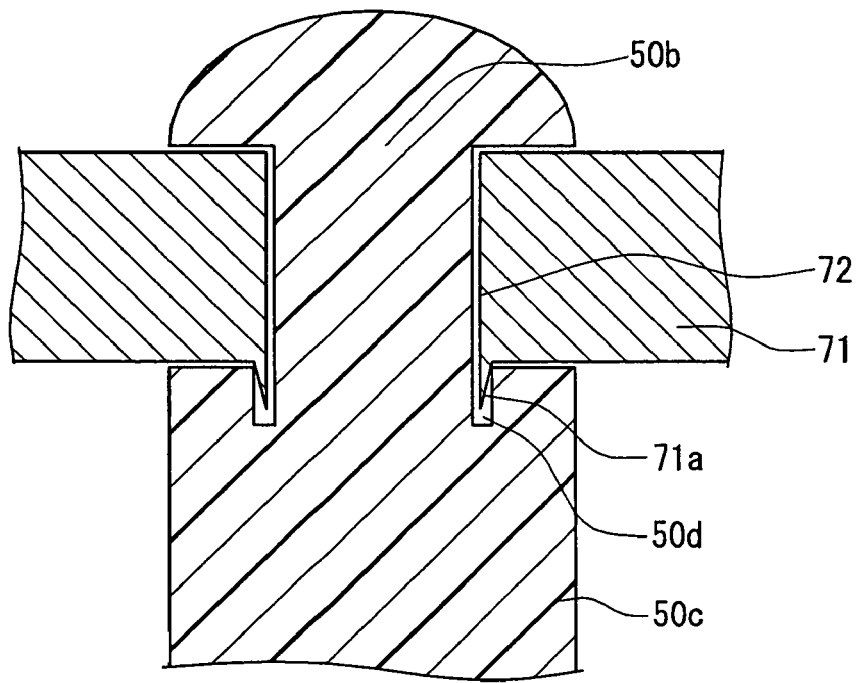
FIG. 2C is a cross-sectional view showing a manner in which a wiring plate of a wiring circuit of the electronic apparatus is fixed to the columnar portion of the case of the electronic apparatus.

As shown in FIGS. 2A-2C, the columnar portions 50c may have groove portions 50d around the top portions 50b. The groove portions 50d prevent the columnar portions 50c from being cracked by a burr 71a produced when the through holes 72 are formed by a punching process.

The base portion 50a, the columnar portions 50c, and the top portions 50b are integrally molded to provide the case 50. Thus, the wiring circuit 70 is fixed to the case 50 without special fixing parts so that the electronic apparatus 100 can be manufactured at low cost. The wiring plates 71 having no through hole 72 may be placed on columnar portions (not shown) other than the columnar portions 50c and sandwiched between the other columnar portions and resin member (nor shown) to be fixed to the case 50.

As shown in FIGS. 1A and 3A, the electronic devices 80 are mounted on an inner side of the wiring circuit 70 to face the base portion 50a of the case 50. In short, the electronic devices 80 are positioned between the base portion 50a and the wiring circuit 70. Therefore, even when the electronic devices 80 have different heights, an outer side of the wiring circuit 70 is flat. Thus, the electronic devices 80 are prevented from being caught in something and destroyed. Alternatively, the electronic devices 80 may be mounted on each side of the wiring circuit 70. In such an approach, high-density mounting of the electronic devices 80 can be achieved so that the electronic apparatus 100 can be reduced in size.

The wiring plates 71 are metal plates having an enough thickness to resist a large current for operating the electronic devices 80 and to release heat generated by the electronic devices 80. Therefore, the electronic devices 80 can have a large operating current to drive an actuator. Further, the wiring plates 71 are spaced from the base portion 50a of the case 50, so that the heat is released in the space efficiently and thermal stress of the case 50 on the solder pastes 90 is reduced.

In the electronic apparatus 100, since the electronic devices 80 are mounted to the wiring plates 71 through the solder pastes 90, the electronic devices 80 are mounted to the wiring plates 71 at once in the thermal reflow process. Therefore, the electronic apparatus 100 can achieve high-density mounting and low manufacturing cost. Since the columnar portions 50c, where the wiring plates 71 are fixed, can be provided in desired locations on the base portion 50a of the case 50, flexibility of circuit design is increased. Therefore, the wiring circuit 70 can have various circuit patterns to provide a large-scale circuit used for a vehicle control system such as an anti-lock braking system (ABS), or an electronic stability control (ESC).

As described above, the electronic apparatus 100 includes the wiring circuit 70 constructed by the wiring plates 71. The wiring plates 71 have the enough thickness to resist the large current and to release the heat generated by the electronic devices 80. The wiring plates 71 are spaced from the base portion 50a so that the heat generated by the electronic devices 80 is released in the space efficiently. Therefore, the electronic apparatus 100 can be installed in a high temperature environment such as in a vehicle. Therefore, the electronic apparatus 100 can be used in the vehicle control system such as the ABS or the ESC.

Figure 4A:
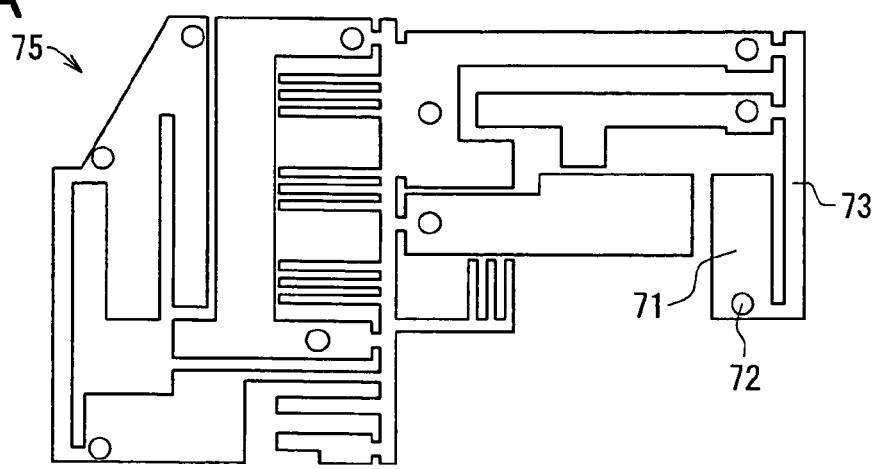
FIGS. 4A-6B are views of manufacturing processes of the electronic apparatus.

The electronic apparatus 100 is manufactured as follows:
First, a one-piece plate 75 shown in FIG. 4A is prepared. The one-piece plate 75 has a shape such that the wiring plates 71 are connected together by joint plates 73. A flat metal plate is shaped into the one-piece plate 75 by means of a punching process, etching process, or the like. Thus, the one-piece plate 75 is easily prepared so that the manufacturing cost of the electronic apparatus 100 can be reduced.

At the same time, the through holes 72 are formed in some of the wiring plates 71. When the flat metal plate is shaped into the one-piece plate 75 by means of the punching process, the burr 71a shown in FIG. 2C may be produced. As described above, the columnar portions 50c may have the groove portions 50d around the top portions 50b. The groove portions 50d receive the burr 71a and prevent the columnar portions 50c from being cracked by the burr 71a. The burr 71a may act as a dam for preventing overflow of the solder pastes 90 in the thermal reflow process, depending on the location and shape of the through holes 72.

Figure 4B:
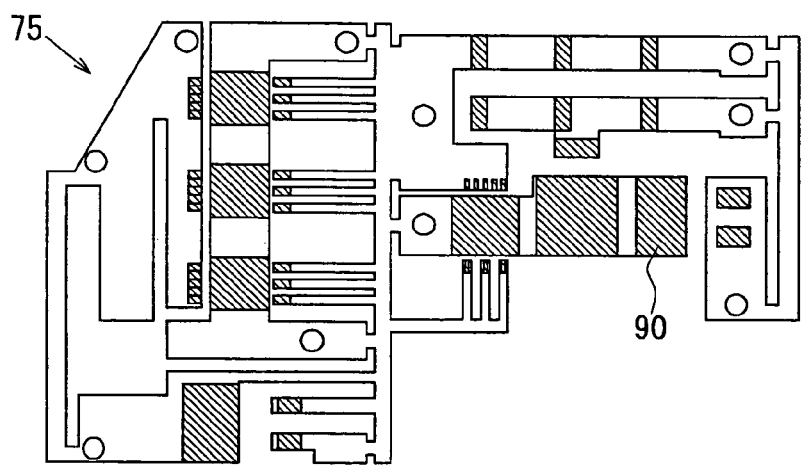
Figure 4C:
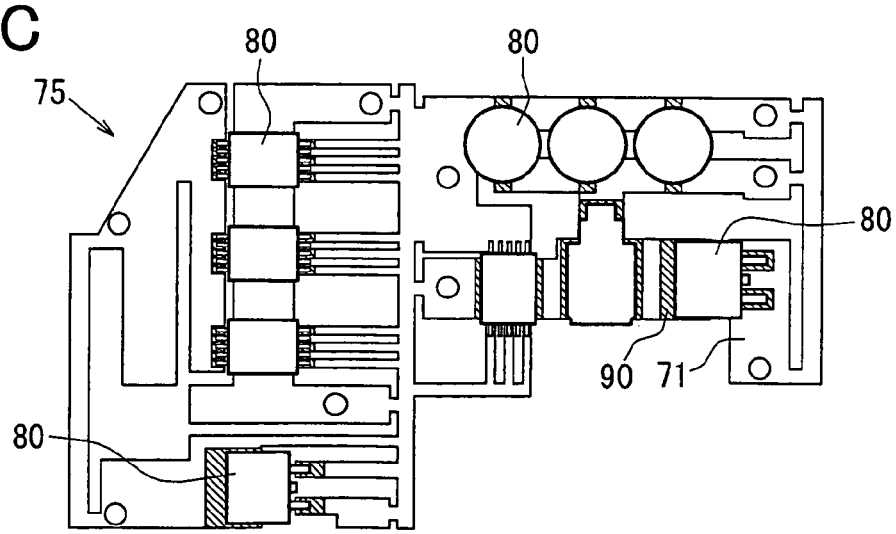

Then, as shown in FIG. 4B, the solder pastes 90 are printed on predetermined regions on the one-piece plate 75. As described above, it is preferable that the solder pastes 90 are made of the lead free solder having the lead content of less than or equal to 0.1 wt % to avoid the use of the hazardous material. Since the lead free solder have the low wettability, the solder pastes 90 can suitably spread over the wiring plates 71 in the thermal reflow process described below.

Next, the electronic devices 80 are placed on the solder pastes 90 printed on the one-piece plate 75. Then, the electronic devices 80 are soldered on the wiring plates 71 of the one-piece plate 75 at once in the thermal reflow process.

Figure 5A:
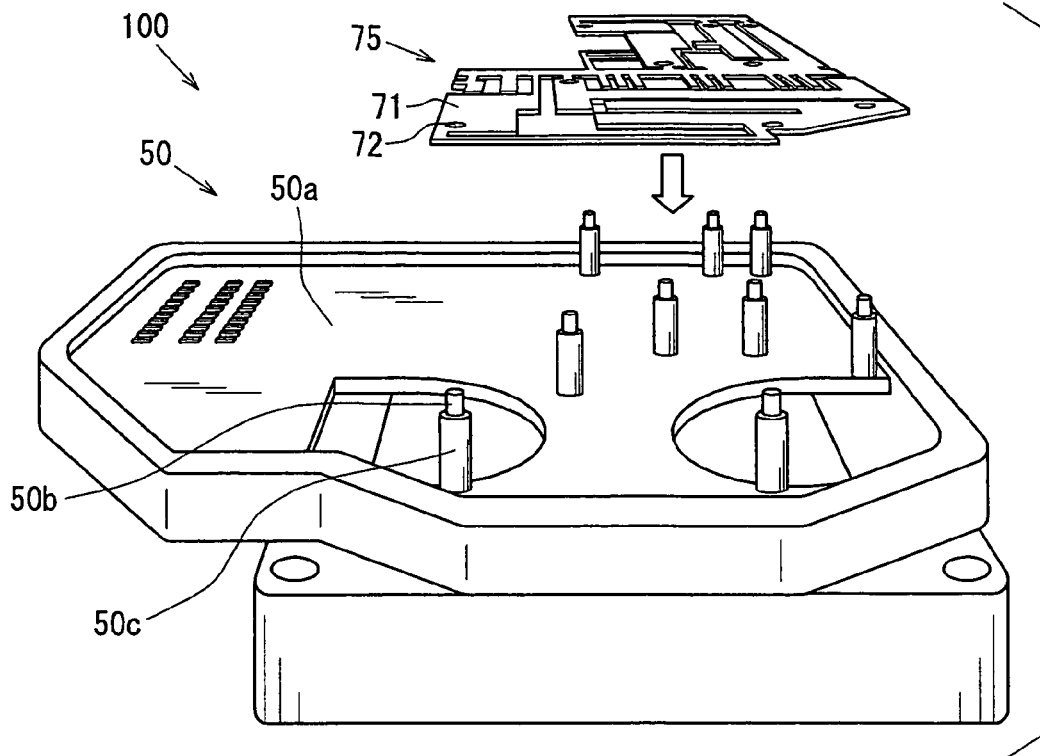
Figure 5B:
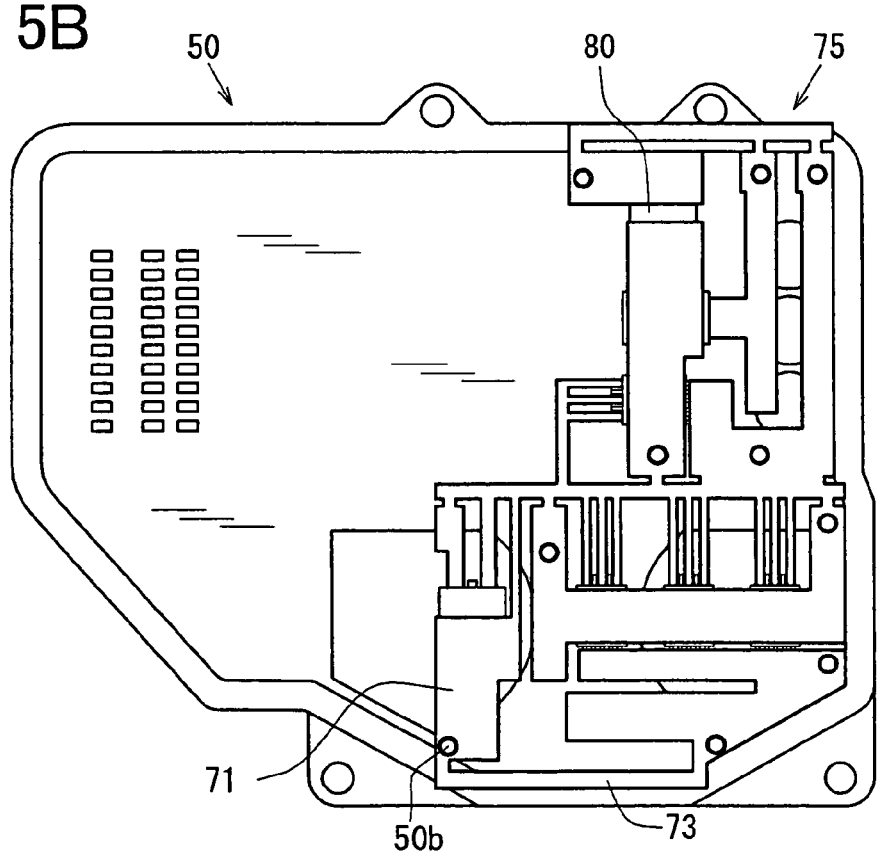

Then, as shown in FIGS. 5A and 5B, the one-piece plate 75 are placed on the columnar portions 50c of the case 50 by inserting the top portions 50b of the columnar portions 50c though the through holes 72 of the wiring plates 71. Then, the top portions 50b are deformed and fixed to the wiring plates 71 by application of heat and pressure. The wiring plates 71 having no through hole 72 are placed on the other columnar portions (not shown) and sandwiched between the other columnar portions and the other resin member (not shown). Thus, the one-piece plate 75 is fixed to the case 50.

The base portion 50a, the columnar portions 50c, and the top portions 50b are integrally molded to form the case 50. Therefore, the one-piece plate 75 is fixed to the case 50 without the special fixing parts so that the manufacturing cost of the electronic apparatus 100 can be reduced.

Figure 6A:
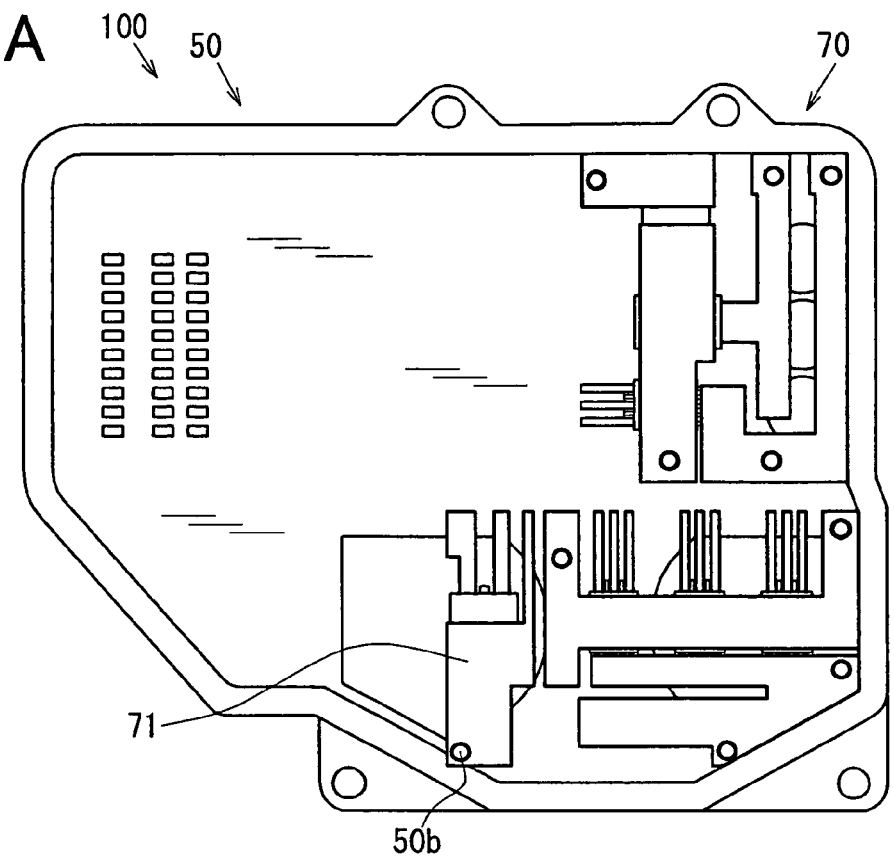

Next, as shown in FIG. 6A, the joint plates 73 are removed from the one-piece plate 75 to form the wiring circuit 70.

Figure 6B:
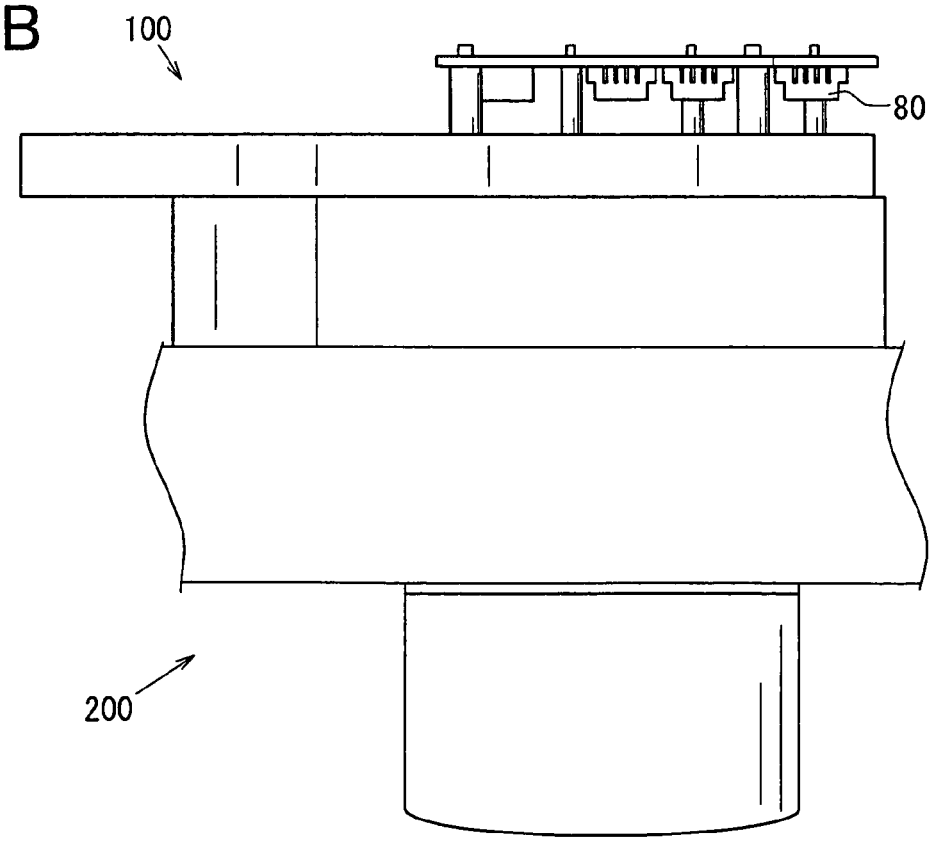

Thus, the electronic apparatus 100 is manufactured and mounted to, for example, an actuator 200 as shown in FIG. 6B.

(Modifications)

The embodiment described above may be modified in various ways.

Figure 7A:
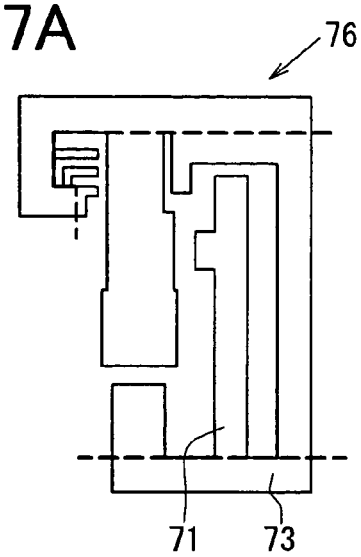
FIG. 7A is a schematic view of the wiring circuit of the electronic apparatus.

A one-piece plate 76 shown in FIG. 7A has the same structure as the one-piece plate 75 described in the embodiment. In short, in the one-piece plate 76, the wiring plates 71 are connected together by the joint plates 73 defined by dashed lines.

Figure 7B:
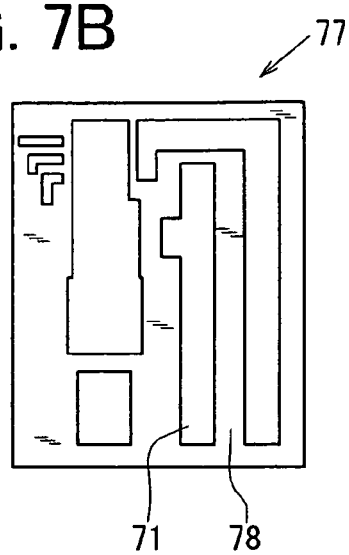
FIG. 7B is a schematic view of a wiring circuit according to a modification of the embodiment.

In contrast, in a one-piece plate 77 shown in FIG. 7B, the wiring plates 71 are bonded to a first heat resistant sheet 78. Thus, the wiring plates 71 are connected together by the first heat resistant sheet 78. The first heat resistant sheet 78 is removed from the one-piece plate 77 in a process corresponding to the process shown in FIG. 6A. Since the first heat resistant sheet 78 is easily removed, the manufacturing cost of the electronic apparatus 100 can be reduced.

Figure 8A:
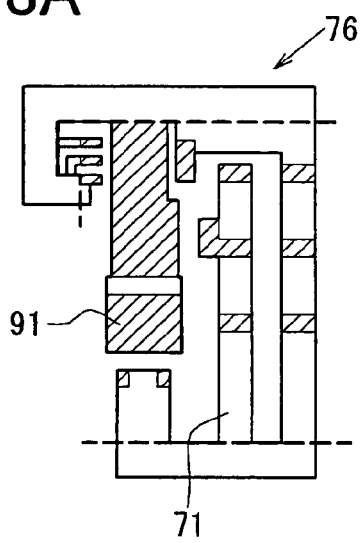
FIG. 8A is a schematic view of the wiring circuit of FIG. 7A having a metal layer for controlling a solder flow.
Figure 8B:
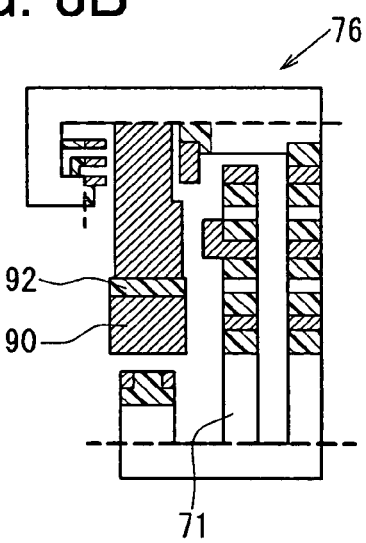
FIG. 8B is a schematic view of the wiring circuit of FIG. 7A having a solder resist for controlling the solder flow.
Figure 8C:
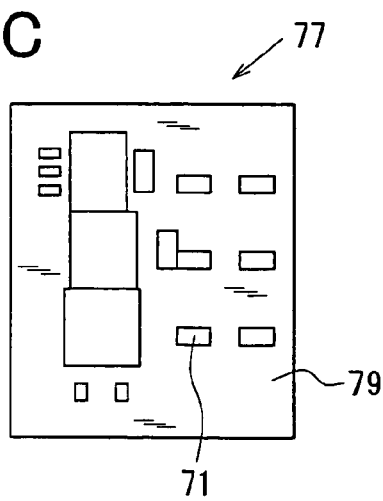
FIG. 8C is a schematic view of the wiring circuit of FIG. 7B having a heat resistant sheet for controlling the solder flow.
Figure 9:
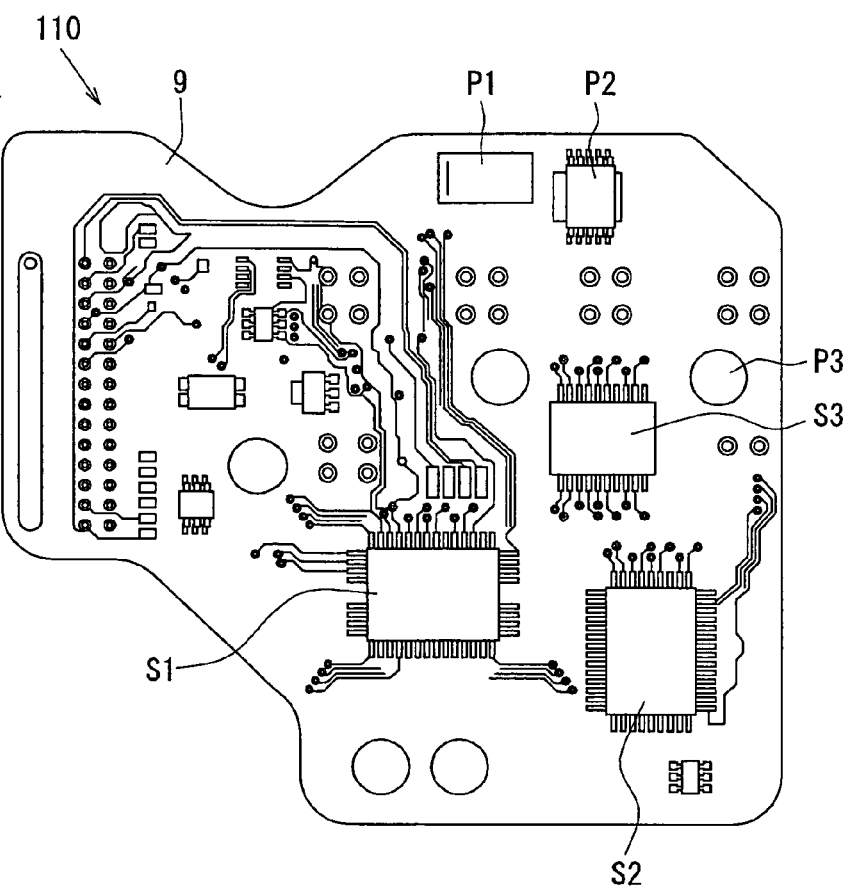
FIG. 9 is a top view of a circuit board of a conventional electronic apparatus.
Figure 10:
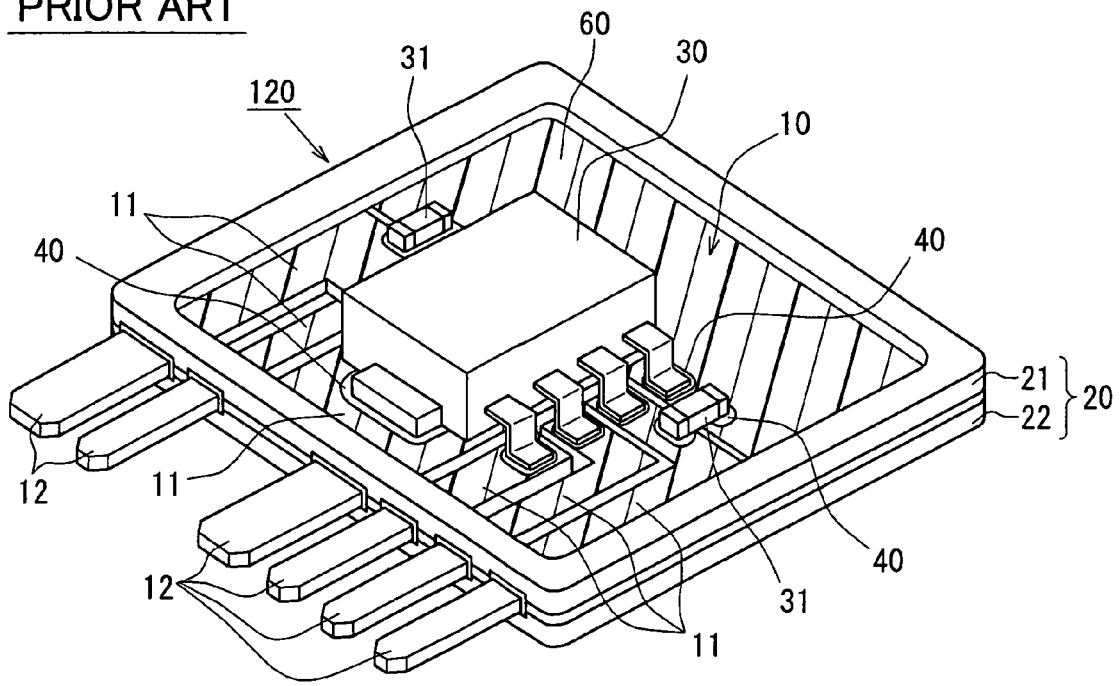
FIG. 10 is a perspective view of a circuit board of another conventional electronic apparatus.

FIGS. 8A-8C show methods to control the flow of the solder pastes 90 in the reflow process.

As shown in FIG. 8A, in the one-piece plate 76, a metal 91 made of a different material than that of the wiring plates 71 may be formed to the regions where the solder pastes 90 are printed. For example, the regions may be plated with the metal 91 having a greater wettability than the wiring plates 71. In such an approach, the flow of the solder pastes 90 in the reflow process can be limited to the regions.

As shown in FIG. 8B, in the one-piece plate 76, solder resists 92 may be formed around the regions to prevent overflow of the solder pastes 90. In such an approach, the flow of the solder pastes 90 in the reflow process can be limited to the regions.

As shown in FIG. 8C, in the one-piece plate 77, a second heat resistant sheet 79 having openings where the regions are exposed may be bonded to the first heat resistant sheet 78. The second heat resistant sheet 79 functions in the same way as the solder resists 92 and prevents the overflow of the solder pastes 90. In such an approach, the flow of the solder pastes 90 in the reflow process can be limited to the regions.

Such changes and modifications are to be understood as being within the scope of the present invention as defined by the appended claims.

What is claimed is:

1. A method of manufacturing an electronic apparatus, comprising; preparing a one-piece plate having a plurality of wiring plates connected together by a joint member and a case having a base portion and a plurality of columnar portions extending from the base portion; printing a solder-paste on a predetermined-region of the wiring plates; mounting a plurality of electronic devices on the solder paste; reflowing the solder paste to solder the electronic devices to the wiring plates; fixing the one-piece plate to the columnar portions of the case; and removing the joint member from the one-piece plate to form a wiring circuit.

2. The method according to claim 1, wherein the joint member is a metal plate unitary with the wiring plates.

3. The method according to claim 1, wherein the joint member is a first heat resistant sheet, and the preparing step includes bonding the wiring plates to the first heat resistant sheet.

4. The method according to claim 1, further comprising: forming a metal layer to the region where the solder paste is printed, wherein the metal layer is made of a different material than that of the wiring plates.

5. The method according to claim 1, further comprising: placing a solder resist around the region where the solder paste is printed.

6. The method according to claim 1, further comprising: bonding a second heat resistant sheet to the one-piece plate, wherein the second heat resistant has an opening through which the region where the solder paste is printed is exposed.

7. The method according to claim 1, wherein the solder paste is made of a lead free solder having a lead content of less than or equal to 0.1 percent by weight.

8. The method according to claim 1, wherein the preparing step includes forming a through hole in the wiring plates, the fixing step includes inserting a top portion of the columnar portions through the through hole of the wiring plates and deforming the top portion by application of heat.

* * * * *